United States Patent
Yoshizaki et al.

(10) Patent No.: US 10,703,936 B2
(45) Date of Patent: Jul. 7, 2020

(54) POLISHING COMPOSITION

(71) Applicant: FUJIMI INCORPORATED, Kiyosu-shi, Aichi (JP)

(72) Inventors: Yukinobu Yoshizaki, Kiyosu (JP); Koichi Sakabe, Kiyosu (JP); Yusuke Kadohashi, Kiyosu (JP)

(73) Assignee: FUJIMI INCORPORATED, Kitosu-Shi (JP)

( * ) Notice: Subject to any disclaimer, the term of this patent is extended or adjusted under 35 U.S.C. 154(b) by 0 days.

(21) Appl. No.: 16/089,935

(22) PCT Filed: Mar. 15, 2017

(86) PCT No.: PCT/JP2017/010521
§ 371 (c)(1),
(2) Date: Sep. 28, 2018

(87) PCT Pub. No.: WO2017/169808
PCT Pub. Date: Oct. 5, 2017

(65) Prior Publication Data
US 2019/0112505 A1   Apr. 18, 2019

(30) Foreign Application Priority Data

Mar. 30, 2016 (JP) ................... 2016-067146
Mar. 30, 2016 (JP) ................... 2016-067158

(51) Int. Cl.
| | | |
|---|---|---|
| C09G 1/02 | (2006.01) | |
| H01L 21/321 | (2006.01) | |
| H01L 21/306 | (2006.01) | |
| H01L 21/3105 | (2006.01) | |
| C09K 3/14 | (2006.01) | |
| B24B 37/04 | (2012.01) | |

(52) U.S. Cl.
CPC .............. *C09G 1/02* (2013.01); *B24B 37/044* (2013.01); *C09K 3/1436* (2013.01); *H01L 21/30625* (2013.01); *H01L 21/31053* (2013.01); *H01L 21/31055* (2013.01); *H01L 21/3212* (2013.01)

(58) Field of Classification Search
CPC . C09G 1/02; H01L 21/3212; H01L 21/30625; H01L 21/31055; H01L 21/304; B24B 37/044; C09K 3/1436
See application file for complete search history.

(56) References Cited

U.S. PATENT DOCUMENTS

| | | |
|---|---|---|
| 6,383,239 B1 | 5/2002 | Suzuki et al. |
| 2003/0022499 A1 | 1/2003 | Lee et al. |
| 2004/0033764 A1 | 2/2004 | Lee et al. |
| 2014/0220779 A1 | 8/2014 | Kim et al. |
| 2015/0232705 A1 | 8/2015 | Kachi et al. |
| 2015/0284593 A1 | 10/2015 | Wang et al. |
| 2015/0315418 A1* | 11/2015 | Umeda .................... C09G 1/02 252/79.1 |
| 2015/0344738 A1* | 12/2015 | Onishi ..................... C09G 1/02 438/692 |
| 2019/0276706 A1* | 9/2019 | Yoshizaki ............. C09K 3/1409 |

FOREIGN PATENT DOCUMENTS

| | | |
|---|---|---|
| JP | H08-20765 A | 1/1996 |
| JP | 2000-265159 A | 9/2000 |
| JP | 2002-313760 A | 10/2002 |
| JP | 2004-079984 A | 3/2004 |
| JP | 2005-179421 A | 7/2005 |
| JP | 2015-096619 A | 5/2015 |
| JP | 2015-174953 A | 10/2015 |
| JP | 2015-201644 A | 11/2015 |
| WO | WO-2014/041991 A1 | 3/2014 |
| WO | WO-2014/119301 A1 | 8/2014 |

OTHER PUBLICATIONS

Chemical Book, 2017, Sodium lauryl polyoxyethylene ether sulfate.*
International Search Report with English translation issued in corrresponding application No. PCT/JP017/010521 dated May 16, 2017.

* cited by examiner

*Primary Examiner* — Duy Vu N Deo
(74) *Attorney, Agent, or Firm* — Foley & Lardner LLP

(57) ABSTRACT

To provide a technology by which, on the occasion of polishing an object to be polished including: (a) material having silicon-nitrogen bonds; and (b) other material, the ratio of the polishing speed for the material (a) with respect to the polishing speed for the material (b) can be increased. The polishing composition of the present invention is a polishing composition used for polishing an object to be polished including: (a) material having silicon-nitrogen bonds; and (b) other material, the polishing composition including: an organic acid-immobilized silica; and a particular selection ratio improver for increasing the ratio of the polishing speed for the material (a) with respect to the polishing speed for the material (b).

11 Claims, No Drawings

POLISHING COMPOSITION

TECHNICAL FIELD

The present invention relates to a polishing composition.

BACKGROUND ART

In recent years, new microprocessing technologies have been developed along with high-level integration and performance enhancement of large scale integration (LSI). Chemical mechanical polishing (CMP) methods constitute one class of such technologies, and chemical mechanical polishing is a technology that is frequently utilized for the flattening of an interlayer insulating film, formation of a metal plug, and formation of embedded wiring (damascene wiring) in an LSI production process, particularly a multi-layer wiring forming process.

This CMP has been applied to various processes in the manufacture of semiconductor devices, and one of such processes may be, for example, application to a gate forming process in transistor production. During transistor production, there are occasions in which polishing of materials such as metals, silicon, silicon oxide, polycrystalline silicon (polysilicon), and silicon nitride is needed, and depending on the structure of transistors, it is required to control the polishing rates for various materials.

For example, in recent years, films having lower dielectric constants and lower strength (Low-k films) are used. This is because since the distance between wirings is close in high-end devices, when an insulating film having a high dielectric constant is used, electrical defects may occur between wirings. However, since such Low-k films have very low strength, there has been a problem that the films are polished away to an excessive degree at the time of processing by CMP. Thus, there has been a demand for a technology, by which at the time of polishing a barrier layer, the polishing speed for a film to be polished can be maintained at a high level, while the polishing speed for a Low-k film can be sufficiently suppressed.

A technology that meets such a demand is disclosed in Patent Literature 1. Patent Literature 1 discloses a polishing composition including an oxidizing agent and a nonionic compound having a weight average molecular weight of 1,000 or less.

CITATION LIST

Patent Literature

Patent Literature 1: WO 2014/041991 A

SUMMARY OF INVENTION

Technical Problem

Meanwhile, the inventors came across an idea that in regard to the demand that it is wished to control the polishing rates for various materials such as a Low-k film, there are additional occasions in which it is desirable to selectively polish a material containing silicon-nitrogen bonds, such as a silicon nitride film.

However, in Patent Literature 1, there is no disclosure regarding a technology for selectively polishing a material containing silicon-nitrogen bonds, such as a silicon nitride film, and the polishing composition could not exhibit high selectivity in the polishing speed for a material containing silicon-nitrogen bonds, such as a silicon nitride film.

Therefore, it is an object of the present invention to provide a technology by which, on the occasion of polishing an object to be polished including: (a) material having silicon-nitrogen bonds; and (b) other material, the ratio of the polishing speed for the material (a) with respect to the polishing speed for the material (b) can be increased.

Solution to Problem

The inventors of the present invention repeatedly conducted a thorough investigation in order to solve the problems described above. As a result, it was found that the above problems are solved by a polishing composition used for polishing an object to be polished including: (a) material having silicon-nitrogen bonds; and (b) other material, the polishing composition including: an organic acid-immobilized silica; and a selection ratio improver capable of improving the ratio of the polishing speed for the material (a) with respect to the polishing speed for the material (b), wherein the selection ratio improver is (i) a compound represented by at least one of the following Formula 1 and the following Formula 2:

[Chemical Formula 1]

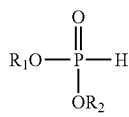

(1)

[Chemical Formula 2]

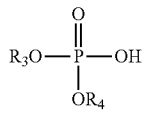

(2)

in Formula 1 and Formula 2, $R_1$, $R_2$, $R_3$, and $R_4$ each independently represent a substituted or unsubstituted alkyl group having 1 to 20 carbon atoms, or a substituted or unsubstituted aryl group having 6 to 20 carbon atoms;

(ii) a polymer having a constituent unit derived from an unsaturated carboxylic acid; or (iii) a compound represented by the following Formula 3:

[Chemical Formula 3]

(3)

in Formula 3, $R_5$ represents a substituted or unsubstituted branched alkyl group having 3 to 20 carbon atoms, or is represented by the following form:

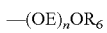  [Chemical Formula 4]

E represents an alkylene group having 1 to 3 carbon atoms; $R_6$ represents a substituted or unsubstituted branched alkyl group having 3 to 20 carbon atoms, or an aryl group having a branched alkyl group having 3 to 20 carbon atoms; n represents 2 to 100; provided that a plurality of E may be identical with or different from each other; and the selection ratio improver may be in the form of a salt.

Effect of the Invention

According to the present invention, a technology by which on the occasion of polishing an object to be polished including: (a) material having silicon-nitrogen bonds; and (b) other material, the ratio of the polishing speed for the material (a) with respect to the polishing speed for the material (b) can be increased, can be provided.

Furthermore, according to the present invention, since high selectivity can be exhibited for the polishing speed for (a) material containing silicon-nitrogen bonds, such as a silicon nitride film, with respect to (b) other material (for example, a metal material, an insulating material, or a low permittivity material), it is made possible to achieve processing into a desired state in a device production process.

DESCRIPTION OF EMBODIMENTS

Hereinbelow, embodiments of the present invention are described. Meanwhile, the present invention is not limited to the following embodiments only. According to the present specification, the expression "X to Y" means "X or more and Y or less". Furthermore, unless particularly stated otherwise, operations and measurement of physical properties are carried out under the conditions of room temperature (20° C. to 25° C.)/relative humidity of 40% to 50% RH.

(Polishing Composition)

The present invention relates to a polishing composition used for polishing an object to be polished including: (a) material having silicon-nitrogen bonds; and (b) other material, the polishing composition including: an organic acid-immobilized silica; and a selection ratio improver capable of improving the ratio of the polishing speed for the material (a) with respect to the polishing speed for the material (b), in which the selection ratio improver is: (i) at least one of a compound represented by the following Formula 1 and a compound represented by the following Formula 2:

[Chemical Formula 5]

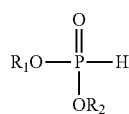

(1)

[Chemical Formula 6]

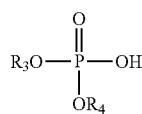

(2)

in Formula 1 and Formula 2, $R_1$, $R_2$, $R_3$, and $R_4$ each independently represent a substituted or unsubstituted alkyl group having 1 to 20 carbon atoms, or a substituted or unsubstituted aryl group having 6 to 20 carbon atoms; (ii) a polymer having a constituent unit derived from an unsaturated carboxylic acid; or (iii) a compound represented by the following Formula 3:

[Chemical Formula 7]

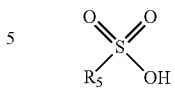

(3)

in Formula 3, $R_5$ represents a substituted or unsubstituted branched alkyl group having 3 to 20 carbon atoms, or is represented by the following form:

—(OE)$_n$OR$_6$ [Chemical Formula 8]

E represents an alkylene group having 1 to 3 carbon atoms; $R_6$ represents a substituted or unsubstituted branched alkyl group having 3 to 20 carbon atoms, or an aryl group having a branched alkyl group having 3 to 20 carbon atoms; n represents 2 to 100, provided that a plurality of E may be identical with or different from each other; and the selection ratio improver may be in the form of a salt.

Due to such a configuration, on the occasion of polishing an object to be polished that includes: (a) material having silicon-nitrogen bonds; and (b) other material, the ratio of the polishing speed of the material (a) with respect to the polishing speed of the material (b) can be increased. Furthermore, since high selectivity can be exhibited for the polishing speed for (a) material containing silicon-nitrogen bonds, such as a silicon nitride film, with respect to (b) other material (for example, a metal material, an insulating material, or a low permittivity material), it is made possible to achieve processing into a desired state in a device production process.

(Object to be Polished)

The object to be polished of the present invention includes (a) material having silicon-nitrogen bonds; and (b) other material.

((a) Material having silicon-nitrogen bonds)

Examples of the (a) material having silicon-nitrogen bonds (in the present specification, also simply referred to as "material (a)") include silicon nitride and SiCN (silicon carbonitride).

((b) Other material)

The (b) other material (in the present specification, also simply referred to as "material (b)") is not particularly limited as long as the material is different from the material having silicon-nitrogen bonds, and examples include silicon-containing materials (other than materials having silicon-nitrogen bonds), various insulating material, and various metal materials.

According to a preferred embodiment of the present invention, the (b) other material is at least one selected from the group consisting of a metal material such as tungsten, tantalum, titanium, cobalt, ruthenium, hafnium, or aluminum; an alloy material formed by combining the above-described metal material with nitrogen, oxygen, silicon, carbon, or phosphorus; a material having silicon-silicon bonds; a low permittivity material (Low-k material); and an insulating material. When such an object to be polished is used, high selectivity for the polishing speed can be exhibited more effectively.

Here, examples of the material having silicon-silicon bonds include polysilicon, amorphous silicon, single crystal silicon, n-doped single crystal silicon, and p-doped single crystal silicon.

The low permittivity material (Low-k material) is a material whose relative permittivity k is lower than that of silicon oxide (k=4.0), and the material is preferably a material having a relative permittivity k of 3.0 or less. Specifically, the low permittivity material is at least one selected from the group consisting of SiOC, silicon oxide containing a methyl group, fluorinated silicon oxide (SiOF), benzocyclobutene (BCB), hydrogen silsesquioxane (HSQ), methyl silsesquioxane (MSQ), hydride-methyl silsesquioxane (HMSQ), a polyimide-based polymer, an allylene ether-based polymer, a cyclobutene-based polymer, and perfluorocyclobutene (PFCB).

The insulating material is a material having a volume resistivity of $1\times10^{10}$ Ω·cm or more, the material being a material other than those described above. Examples include organic materials such as an acrylic resin, a phenolic resin, a fluorine-based resin, an epoxy-based resin, a cardo-based resin, a vinyl-based resin, an imide-based resin, a novolac-based resin, and poly-para-xylene; and inorganic materials such as TEOS (silicon oxide) and $Al_2O_3$.

(Selection Ratio Improver)

In the present invention, the selection ratio for the material (a) is increased by incorporating a selection ratio improver into the polishing composition.

The selection ratio improver is the following (i), (ii), or (iii), and these may also be used in appropriate combination.

(i)

The selection ratio improver according to a preferred embodiment of the present invention is represented by at least one of the following Formula 1 and the following Formula 2:

[Chemical Formula 9]

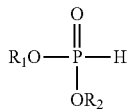

(1)

[Chemical Formula 10]

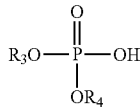

(2)

in Formula 1 and Formula 2, $R_1$, $R_2$, $R_3$, and $R_4$ each independently represent a substituted or unsubstituted alkyl group having 1 to 20 carbon atoms, or a substituted or unsubstituted aryl group having 6 to 20 carbon atoms.

The mechanism, by which the selection ratio for the material (a) is increased by adding this selection ratio improver to the polishing composition, is not clearly understood; however, the mechanism is speculated as follows. That is, it may be considered to be because of high affinity between the phosphorus atoms contained in the selection ratio improver and the nitrogen atoms in the material (a), and high affinity between the alkyl group or aryl group contained in the selection ratio improver and the silicon atoms in the material (a). In this case, for example, if even any one of $R_1$, $R_2$, $R_3$, and $R_4$ is a hydrogen atom, the affinity is not enhanced, and the predetermined effects of the present invention cannot be obtained. However, it is needless to say that the technical scope of the present invention is not intended to be limited by such a mechanism.

According to an embodiment of the present invention, the number of carbon atoms of the alkyl group is preferably 2 to 15, more preferably 2 to 14, and even more preferably 2 to 13. According to such an embodiment, high selectivity for the polishing speed can be exhibited more effectively.

Here, although there are no limitations, specific examples of the alkyl group having 1 to 20 carbon atoms include a methyl group, an ethyl group, a propyl group, an isopropyl group, an n-butyl group, an isobutyl group, a sec-butyl group, a tert-butyl group, a pentyl group, an isopentyl group, a neopentyl group, a 2-ethylhexyl group, a hexyl group, a heptyl group, an octyl group, a nonyl group, a decyl group, an undecyl group, a dodecyl group (lauryl group), a tridecyl group, a tetradecyl group (myristyl group), a pentadecyl group, a hexadecyl group (palmityl group), a heptadecyl group, an octadecyl group (stearyl group), a nonadecyl group, and an eicosyl group.

According to an embodiment, in a case in which $R_1$, $R_2$, $R_3$, and $R_4$ each represent an unsubstituted alkyl group having 1 to 20 carbon atoms, the number of carbon atoms of the alkyl group is more preferably 3 to 14, and even more preferably 4 to 13. When the number of carbon atoms is in such a range, high selectivity for the polishing speed can be exhibited more effectively.

Meanwhile, according to an embodiment, in a case in which $R_1$, $R_2$, $R_3$, and $R_4$ each represent a substituted alkyl group having 1 to 20 carbon atoms, the substituent is preferably an alkoxy group having 1 to 10 carbon atoms or an aryl group having 6 to 20 carbon atoms. According to such an embodiment, high selectivity for the polishing speed can be exhibited more effectively.

Here, the number of carbon atoms of the alkoxy group is preferably 2 to 8, more preferably 3 to 6, and even more preferably 4 to 6, from the viewpoint that high selectivity for the polishing speed can be exhibited more effectively. Furthermore, examples of the aryl group include a phenyl group, a naphthyl group, and an anthracenyl group (anthryl group). As such, when this substituent has carbon atoms of an alkoxy group, an aryl group or the like, the number of carbon atoms of the alkyl group is preferably 1 to 4, and more preferably 2 or 3.

In the present embodiment, in a case in which $R_1$, $R_2$, $R_3$, and $R_4$ each represent a substituted alkyl group having 1 to 20 carbon atoms, for example, an alkoxyalkyl group such as a methoxymethyl group, an ethoxymethyl group, a propoxymethyl group, a methoxyethyl group, an ethoxyethyl group, a propoxyethyl group, an isopropoxyethyl group, a butoxyethyl group, a hexyloxyethyl group, a heptyloxyethyl group, an octyloxyethyl group, or a cyclohexyloxyethyl group; and an aralkyl group such as a benzyl group, a phenethyl group, a naphthylmethyl group, or an anthrylmethyl group are suitable. As such, the alkyl group may have an aromatic ring structure in a chain-like structure or an alicyclic structure.

Meanwhile, according to an embodiment, in a case in which $R_1$, $R_2$, $R_3$, and $R_4$ each represent an unsubstituted aryl group having 6 to 20 carbon atoms, the groups listed above can be suitably applied as the aryl group.

According to another embodiment, in a case in which $R_1$, $R_2$, $R_3$ and $R_4$ each represent a substituted aryl group having 6 to 20 carbon atoms, the substituent is preferably an alkyl group having 1 to 20 carbon atoms or an alkoxy group having 1 to 10 carbon atoms.

Regarding specific explanations for the alkyl group having 1 to 20 carbon atoms and the alkoxy group having 1 to 10 carbon atoms, the description given above is similarly valid.

In the present embodiment, in a case in which $R_1$, $R_2$, $R_3$, and $R_4$ each represent an aryl group having 6 to 20 carbon atoms, for example, a tolyl group, a xylyl group, a mesityl group, a methylnaphthyl group, a methylanthryl group, a methoxyphenyl group, and an ethoxyphenyl group are suitable. As such, the aryl group may contain not only an aromatic ring structure but may also contain a chain-like structure or an alicyclic structure in some part.

In view of the above description, according to a preferred embodiment of the present invention, the selection ratio improver is at least one selected from the group consisting of bis(2-ethylhexyl) phosphate, dilauryl hydrogen phosphite, butyl acid phosphate, monobutoxyethyl acid phosphate, and diphenyl hydrogen phosphite. According to such an embodiment, high selectivity for the polishing speed can be exhibited more effectively.

(ii)

The selection ratio improver according to a preferred embodiment of the present invention is a polymer having a constituent unit derived from an unsaturated carboxylic acid (according to the present specification, also simply referred to as "polymer").

Although the mechanism is not clearly understood, the selection ratio for the material (a) is increased by adding the selection ratio improver to the polishing composition.

The polymer of the present invention may be a homopolymer or may be a copolymer, as long as the polymer contains a constituent unit derived from an unsaturated carboxylic acid. However, from the viewpoint of efficiently achieving the predetermined purpose of the present invention, the polymer is preferably a copolymer.

Here, there are also no particular limitations on the structure of the copolymer, and the copolymer may be any of a random copolymer, an alternating copolymer, a periodic copolymer, and a block copolymer. The type of the constituent unit is also not particularly limited as long as there are two or more kinds of constituent units, and there may be three kinds, four kinds, or even more kinds of constituent units.

Examples of the unsaturated carboxylic acid include (meth)acrylic acid, crotonic acid, fumaric acid, (anhydrous) maleic acid, and itaconic acid. The unsaturated carboxylic acid may be in the form of an ester, and examples of the unsaturated carboxylic acid ester include a (meth)acrylic acid ester, a crotonic acid ester, a fumaric acid ester, a maleic acid ester, and an itaconic acid ester. Such an unsaturated carboxylic acid ester refers to a form in which an alkyl group, a hydroxyalkyl group, a group derived from a polyalkylene glycol or the like has been introduced into the carboxyl group of the above-mentioned unsaturated carboxylic acids.

Here, there are no particular limitations on the number of carbon atoms of the alkyl group for the alkyl group and the hydroxyalkyl group; however, the number of carbon atoms is preferably 1 to 10. Preferred examples of such an alkyl group include a methyl group, an ethyl group, a propyl group, an isopropyl group, a n-butyl group, an isobutyl group, a sec-butyl group, a tert-butyl group, a pentyl group, an isopentyl group, a neopentyl group, a 2-ethylhexyl group, a hexyl group, a heptyl group, an octyl group, a nonyl group and a decyl group.

Furthermore, a polyalkylene glycol can be synthesized by addition polymerizing an alkylene oxide, and examples of the alkylene oxide include ethylene oxide, propylene oxide, and butylene oxide.

Among those described above, in order to efficiently provide the predetermined effects of the present invention, according to a preferred embodiment of the present invention, the unsaturated carboxylic acid-derived constituent unit is a constituent unit derived from (meth)acrylic acid or a constituent unit derived from maleic acid.

Furthermore, the polymer of the present invention may also contain other constituent units in addition to the unsaturated carboxylic acid-derived constituent unit, and examples include a constituent unit derived from an α-olefin; a constituent unit derived from an unsaturated nitrile; a constituent unit derived from an unsaturated amide; a constituent unit derived from an aromatic vinyl; a constituent unit derived from an aliphatic vinyl; and a constituent unit derived from an unsaturated bond-containing heterocyclic ring.

Examples of the α-olefin include ethylene, propylene, and butadiene;

examples of the unsaturated nitrile include acrylonitrile and methacrylonitrile;

examples of the unsaturated amide include acrylamide, dimethylacrylamide, methacrylamide, and N-methylolacrylamide;

examples of the aromatic vinyl include styrene and α-methylstyrene;

examples of the aliphatic vinyl include vinyl acetate; and examples of the unsaturated bond-containing saturated heterocyclic ring include N-vinylpyrrolidone and acryloylmorpholine.

According to a preferred embodiment of the present invention, the polymer of the invention is preferably a copolymer, and it is preferable that the polymer contains a constituent unit derived from an aromatic vinyl.

From the viewpoint of efficiently exhibiting the predetermined effects of the present invention, it is preferable that the selection ratio improver of the present invention is not a homopolymer of maleic acid (polymaleic acid).

Meanwhile, the carboxyl group in the constituent unit derived from an unsaturated carboxylic acid may be neutralized by a basic substance. Regarding the basic substance, for example, known basic substances such as a (hydrogen) carbonate, hydroxide of an alkali metal such as sodium, ammonia, and an organic amine may be used as appropriate. Furthermore, the neutralization ratio is not particularly limited, and the neutralization ratio may be adjusted to any arbitrary neutralization ratio, for example, any arbitrary value of 30 mol % to 100 mol % or 50 mol % to 80 mol %. Regarding the method for neutralization, the process may be carried out by adding a basic substance to the polymer, or may be carried out by performing polymerization using monomers that have been partially or entirely neutralized.

There are no particular limitations on the weight average molecular weight of the polymer of the present invention; however, the weight average molecular weight is preferably 2,000 or more, more preferably 4,000 or more, and even more preferably 8,000 or more, and may be 15,000 or more, or even 80,000 or more. Furthermore, the weight average molecular weight is preferably 600,000 or less, more preferably 400,000 or less, even more preferably 200,000 or less, and still more preferably 150,000 or less.

Meanwhile, the method for measuring the weight average molecular weight follows the method disclosed in the Examples.

(iii)

The selection ratio improver according to a preferred embodiment of the present invention is represented by the following Formula 3:

[Chemical Formula 11]

(3)

in Formula 3, $R_5$ represents a substituted or unsubstituted branched alkyl group having 3 to 20 carbon atoms, or the following moiety:

—(OE)$_n$OR$_6$ [Chemical Formula 12]

E represents an alkylene group having 1 to 3 carbon atoms; $R_6$ represents a substituted or unsubstituted branched alkyl group having 3 to 20 carbon atoms, or an aryl group having a branched alkyl group having 3 to 20 carbon atoms; and n represents 2 to 100. A plurality of E may be identical with or different from each other. Here, n is preferably 3 to 50, and more preferably 4 to 25.

According to an embodiment of the present invention, the number of carbon atoms of the branched alkyl group is preferably 3 to 15, more preferably 4 to 13, even more preferably 5 to 11, still more preferably 6 to 10, and particularly preferably 7 to 10. According to such an embodiment, high selectivity for the polishing speed can be exhibited more effectively. The substituent for the substituted or unsubstituted branched alkyl group having 3 to 20 carbon atoms is not particularly limited; however, examples include an alkoxy group having 1 to 10 carbon atoms and an aryl group having 6 to 20 carbon atoms.

Here, although there are no particular limitations, specific examples of the branched alkyl group having 3 to 20 carbon atom include an isopropyl group, an isobutyl group, a sec-butyl group, a tert-butyl group, an isopentyl group, a neopentyl group, a 2-ethylhexyl group, and an isodecyl group. Among these, a 2-ethylhexyl group and an isodecyl group are preferred. According to an embodiment of the present invention, examples of the alkylene group having 1 to 3 carbon atoms include a methylene group, an ethylene group, and a propylene group, and an ethylene group and a propylene group are preferred.

According to an embodiment of the present invention, in regard to the branched alkyl group having 3 to 20 carbon atoms in the aryl group having a branched alkyl group having 3 to 20 carbon atoms, those described above are suitable, and regarding the aryl group, examples include a phenyl group and a naphthyl group.

Meanwhile, it may be considered that even if an additive having a linear alkyl group is used, the predetermined effects of the present invention cannot be expected. The reason is not clearly understood; however, the polishing environment may vary every moment during the polishing process, for example, the environment including the concentration distribution of an additive and the like may vary. Regarding an additive that does not have a branched alkyl group (additive having an aryl group that does not have a linear alkyl group or a branched substituent), it is speculated that there may be some moments at which effects can be exhibited for each environment; however, it is considered that the time points could be very limited or narrow.

The selection ratio improver described above may also be in the form of a salt. There are no particular limitations on the type of the salt. A sodium salt, a potassium salt, an ammonium salt, primary to quaternary amine salts, and the like are suitable; however, there are no limitations on the type of the salt.

The lower limit of the content of the selection ratio improver in the polishing composition of the present invention is preferably 1 ppm by mass or more, more preferably 10 ppm by mass or more, even more preferably 80 ppm by mass or more, and still more preferably 90 ppm by mass or more. When the lower limit has such a value, the effects of the present invention are exhibited more effectively.

The upper limit of the content of the selection ratio improver in the polishing composition of the present invention is preferably 10,000 ppm by mass or less, more preferably 1,000 ppm by mass or less, even more preferably 500 ppm by mass or less, and still more preferably 300 ppm by mass or less. When the upper limit has such a value, it is advantageous from the viewpoints of cost and prevention of remaining of the polishing composition on a wafer.

(Abrasive Grains; Organic Acid-Immobilized Silica)

According to the present invention, organic acid-immobilized silica that works as abrasive grains of the polishing composition is one which is formed by immobilizing an organic acid onto silica (in the present specification, the "organic acid-immobilized silica" may also be simply referred to as "abrasive grains"). Regarding the silica, from the viewpoint of suppressing the generation of abrasion scratches, it is preferable to use colloidal silica.

According to the present invention, it is essential that organic acid-immobilized silica is used as the abrasive grains. Here, if abrasive grains such as silica that does not have an organic acid immobilized thereon are used, the predetermined purpose of the present invention cannot be achieved.

Here, the colloidal silica may be, for example, a product produced according to a sol-gel method. Colloidal silica produced by a sol-gel method is preferable because the content of metal impurities or corrosive ions such as chloride ions, which are diffusible in a semiconductor device, is small. The production of colloidal silica according to a sol-gel method can be carried out by using a conventionally known technique, and specifically, colloidal silica is obtained by using a hydrolysable silicon compound (for example, an alkoxysilane or a derivative thereof) as a raw material and performing hydrolysis and condensation reactions.

Incidentally, immobilization of an organic acid is not accomplished by simply incorporating silica and the organic acid together. For example, when sulfonic acid, which is a kind of organic acid, is to be immobilized onto silica, the immobilization can be carried out by the method described in, for example, "Sulfonic acid-functionalized silica through of thiol groups", Chem. Commun., 246-247 (2003). Specifically, a silane coupling agent having a thiol group, such as 3-mercaptopropyltrimethoxysilane, is coupled to silica, and then thiol groups are oxidized with hydrogen peroxide. Thereby, silica having sulfonic acid immobilized on the surface can be obtained. The colloidal silica used in the Examples also had sulfonic acid groups modified in this manner.

Alternatively, when a carboxylic acid, which is a kind of organic acid, is to be immobilized onto silica, the immobilization can be carried out by the method described in, for example, "Novel Silane Coupling Agents Containing a Photolabile 2-Nitrobenzyl Ester for Introduction of a Carboxy Group on the Surface of Silica Gel", Chemistry Letters, 3, 228-229 (2000). Specifically, silica having a carboxylic acid immobilized thereon can be obtained by coupling a silane coupling agent including a photoreactive 2-nitrobenzyl ester with silica, and then irradiating the resultant with light.

According to a preferred embodiment of the present invention, the organic acid-immobilized silica is sulfonic acid-immobilized silica. According to such an embodiment, superior dispersibility of silica is obtained.

In the polishing composition of the present invention, the lower limit of the average primary particle size of the abrasive grains is preferably 5 nm or more, more preferably 7 nm or more, and even more preferably 10 nm or more. Furthermore, in the polishing composition of the present invention, the upper limit of the average primary particle size of the abrasive grains is preferably 60 nm or less, more preferably 40 nm or less, even more preferably 25 nm or less, and still more preferably 20 nm or less. When the average primary particle size is in such ranges, defects such as scratches occurring on the surface of the object to be polished after polishing is performed using the polishing composition, can be suppressed. Meanwhile, the average primary particle size of the abrasive grains is calculated based on, for example, the specific surface area of the abrasive grains measured by the BET method.

In the polishing composition of the present invention, the lower limit of the average secondary particle size of the abrasive grains is preferably 15 nm or more, more preferably 18 nm or more, and even more preferably 26 nm or more. Furthermore, the upper limit of the average secondary particle size of the abrasive grains is preferably 90 nm or less, more preferably 70 nm or less, even more preferably 50 nm or less, and still more preferably 45 nm or less. When the average secondary particle size is in such a range, surface defects occurring on the surface of the object to be polished after polishing is performed using the polishing composition, can be further suppressed. The secondary particles as used herein refer to particles formed by the abrasive grains associating together in the polishing composition, and this average secondary particle size of the secondary particles can be measured by, for example, a dynamic light scattering method, which is represented by a laser diffraction scattering method.

In regard to the particle size distribution that can be determined by a laser diffraction scattering method for the abrasive grains in the polishing composition of the present invention, the lower limit of the ratio between the diameter D90 of the particles when the cumulative particle mass from the finer particle side reaches 90% of the total mass of the particles, and the diameter D10 of the particles when the cumulative particle mass from the finer particle side reaches 10% of the total mass of the particles (in the present specification, also simply referred to as "D90/D10"), is preferably 1.3 or higher, more preferably 1.4 or higher, even more preferably 1.5 or higher, and still more preferably 1.9 or higher. Furthermore, there are no particular limitations on the upper limit of the ratio D90/D10; however, the upper limit is preferably 5.0 or lower, more preferably 4.0 or lower, even more preferably 3.0 or lower, and still more preferably 2.3 or lower. When the ratio is in such a range, surface defects occurring on the surface of the object to be polished after polishing is performed using the polishing composition can be further suppressed.

The lower limit of the content of the abrasive grains in the polishing composition of the present invention is preferably 0.01% by mass or more, more preferably 0.05% by mass or more, and even more preferably 0.1% by mass or more. Furthermore, the upper limit of the content of the abrasive grains in the polishing composition of the present invention is preferably 20% by mass or less, more preferably 10% by mass or less, even more preferably 5% by mass or less, still more preferably 1% by mass or less, and even more preferably 0.5% by mass or less. When the upper limit is such as this, the production cost for the polishing composition can be suppressed, and surface defects occurring on the surface of the object to be polished after polishing is performed using the polishing composition can be further suppressed.

(Dispersing Medium)

In the polishing composition of the present invention, a dispersing medium can be used in order to disperse the various components that constitute the polishing composition. Regarding the dispersing medium, organic solvents and water may be considered; however, among them, it is preferable that the dispersing medium includes water.

From the viewpoint that impurities may contaminate the object to be polished or inhibit the action of other components, water that does not contain impurities as far as possible is preferred. Specifically, pure water obtained by removing impurity ions with an ion exchange resin and then removing foreign materials through a filter, ultrapure water, or distilled water is preferred.

(pH Adjusting Agent)

The polishing composition of the present invention can be adjusted to any of an acidic region, a neutral region, and a basic region; however, from the viewpoint of increasing the polishing speed for the material (a) such as a nitride film, it is preferable that the polishing composition is adjusted to an acidic region.

The acidic region according to the present invention means that the pH value is lower than 7.0, and the pH value is preferably 0.5 to 6.0, more preferably 1.5 to 4.5, and even more preferably 2.0 to 4.0. Therefore, according to a preferred embodiment of the present invention, the pH value is 0.5 to 6.0. According to such an embodiment, high selectivity for the polishing speed can be exhibited more effectively. Furthermore, the neutral region means that the polishing composition is at pH 7.0. The basic region means that the pH value is higher than 7.0, and the pH value is preferably 8.0 to 13.0. The pH value according to the present invention will refer to a value measured under the conditions described in the Examples.

Specific examples of the pH adjusting agent for adjusting the polishing composition to an acidic region include any of inorganic compounds and organic compounds, and examples include inorganic acids such as sulfuric acid, nitric acid, boric acid, carbonic acid, hypophosphorous acid, phosphorous acid, and phosphoric acid; carboxylic acids such as citric acid, formic acid, acetic acid, propionic acid, benzoic acid, salicylic acid, glyceric acid, oxalic acid, malonic acid, succinic acid, maleic acid, phthalic acid, malic acid, tartaric acid, and lactic acid; and organic acids such as methanesulfonic acid, ethanesulfonic acid, and organic sulfuric acids such as isethionic acid. Furthermore, in the case of divalent or higher-valent acids (for example, sulfuric acid, carbonic acid, phosphoric acid, and oxalic acid) as the above-described acid, the acids may also be in the form of salt as long as one or more protons (H+) can be released. Specific examples include ammonium hydrogen carbonate and ammonium hydrogen phosphate (the type of the counter cation may be basically any cation; however, weakly basic cations (ammonium, triethanolamine, and the like) are preferred).

Specific examples of the pH adjusting agent for adjusting the polishing composition to a basic region include any of inorganic compounds and organic compounds, and examples include hydroxides of alkali metals or salts thereof, quaternary ammonium, quaternary ammonium hydroxide or salts thereof, ammonia, and amines.

Specific examples of the alkali metal include potassium and sodium. Specific examples of the salt include carbonate, hydrogen carbonate, sulfate, and acetate.

Specific examples of quaternary ammonium include tetramethylammonium, tetraethylammonium, and tetrabutylammonium.

Specific examples of the quaternary ammonium hydroxide or salts thereof include tetramethylammonium hydroxide, tetraethylammonium hydroxide, and tetrabutylammonium hydroxide.

Among them, from the viewpoints of the prevention of metal contamination and the ease of diffusion of metal ion into a semiconductor device structure, it is more preferable that the polishing composition includes ammonia, amine, or potassium as a base. Specific examples include potassium hydroxide, potassium carbonate, potassium hydrogen carbonate, potassium sulfate, potassium acetate, and potassium chloride.

(Method for Producing Polishing Composition)

The present invention also provides a method for producing a polishing composition that is used to polish an object to be polished, which includes the material (a); and the material (b) described above, the method including incorporating the organic acid-immmobilized silica and the selection ratio improver into a dispersing medium.

The method for producing the polishing composition is not particularly limited; however, the polishing composition can be obtained by stirring and mixing the organic acid-immobilized silica, the selection ratio improver, and optionally other components in a dispersing medium.

Regarding specific explanations for the material (a), material (b), organic acid-immobilized silica, selection ratio improver, and dispersing medium, the description given above is valid.

Examples of the other components include components such as a pH adjusting agent, an oxidizing agent, a reducing agent, a surfactant, a water-soluble polymer, and an antifungal agent.

The temperature employed at the time of mixing the various components is not particularly limited; however, the temperature is preferably 10° C. to 40° C., and it is also acceptable to heat the system in order to increase the rate of dissolution. The mixing time is also not particularly limited.

(Polishing Method and Method for Producing Substrate)

According to the present invention, a polishing method of polishing an object to be polished using the polishing composition of the present invention is also provided. Furthermore, according to the present invention, a method for producing a substrate is also provided, the method including the polishing method.

Regarding the polishing apparatus, a general polishing apparatus having a polishing table equipped with a holder for retaining a substrate or the like having an object to be polished; a motor capable of varying the speed of rotation; and the like, the polishing table being capable of having a polishing pad (polishing cloth) attached thereto, can be used.

Regarding the polishing pad, a general nonwoven fabric, polyurethane, a porous fluororesin, and the like can be used without any particular limitations. It is preferable that the polishing pad is subjected to grooving processing for collecting the polishing composition.

There are no particular limitations on the polishing conditions, and for example, the speed of rotation of the polishing table is preferably 10 to 500 rpm, the speed of rotation of the carrier is preferably 10 to 500 rpm, while the pressure applied to the substrate having an object to be polished (polishing pressure) is preferably 0.1 to 10 psi. The method for supplying the polishing composition to the polishing pad is also not particularly limited, and for example, a method of continuously supplying the polishing composition using a pump or the like is employed. The amount of supply of this polishing composition is not limited; however, it is preferable that the surface of the polishing pad is covered with the polishing composition of the present invention all the time.

(Method for Improving Selection Ratio)

According to a preferred embodiment of the present invention, a method of improving the ratio of the polishing speed for the material (a) with respect to the polishing speed for the material (b) on the occasion of polishing an object to be polished including (a) material having silicon-nitrogen bonds and (b) other material, is provided and the method includes incorporating an organic acid-immobilized silica and a selection ratio improver into the polishing composition.

Regarding specific explanations for the material (a), material (b), organic acid-immobilized silica, and selection ratio improver, the description given above is valid.

According to the method for increasing the selection ratio of the present invention, the selection ratio for the material (a) with respect to the material (b) is increased compared to the case in which the selection ratio improver of the present invention is not incorporated, as described in the section of Examples.

According to a preferred embodiment of the present invention, in a case in which the material (b) has silicon-silicon bonds, a preferred selection ratio is 10 or higher, more preferably 11 or higher, even more preferably 15 or higher, and still more preferably 20 or higher.

According to a preferred embodiment of the present invention, in a case in which the material (b) is an insulating material, a preferred selection ratio is 23 or higher, more preferably 25 or higher, even more preferably 35 or higher, and still more preferably 50 or higher.

According to a preferred embodiment of the present invention, in a case in which the material (b) is a Low-k material, a preferred selection ratio is 3.2 or higher, more preferably 4 or higher, even more preferably 6 or higher, still more preferably 8 or higher, even more preferably 12 or higher, and still more preferably 30 or higher.

Here, even if the same selection ratio improver is used, the value of the selection ratio for the material (a) may change depending on the type of the material (b). Therefore, whether the selection ratio will be increased by incorporating a selection ratio improver can be determined by comparing the outcome with the outcome in the case where the selection ratio improver is not incorporated, for each and every type of various materials (b).

According to a preferred embodiment of the present invention, when the selection ratio improver is incorporated into the polishing composition, the selection ratio can be increased with respect to two or more kinds of the material (b). More preferably, the selection ratio can be increased with respect to three or more kinds, and even more preferably four or more kinds, of the material (b). When the selection ratio for the material (a) can be increased with respect to such many materials (b), the selection ratio improver can be regarded as having high general-purpose usability.

EXAMPLES

The present invention will be described in more detail using the following Examples and Comparative Examples.

However, the technical scope of the present invention is not intended to be limited to the following Examples only. Furthermore, in the Examples described below, unless particularly stated otherwise, the operations were carried out under the conditions of room temperature (25° C.)/relative humidity of 40% to 50% RH.

<Production of Polishing Composition>

A polishing composition was produced by mixing abrasive grains (sulfonic acid-immobilized colloidal silica; average primary particle size: 14 nm, average secondary particle size: 34 nm, D90/D10: about 2.1); a pH adjusting agent; and various additives shown in the following table in a dispersing medium (pure water), such that the proportion of the abrasive grains would be 0.2% by mass, the concentrations of the various additives would be the concentrations shown in the following table, and the pH value would be 3.0 (mixing temperature: about 25° C., mixing time: about 10 minutes).

In addition, all the polishing compositions were adjusted to pH 3.0 by selecting and adding citric acid or potassium hydroxide (KOH) in an appropriate amount.

The pH of a polishing composition (liquid temperature: 25° C.) was checked using a pH meter (manufactured by Horiba, Ltd., product No.: LAQUA). Regarding the weight average molecular weights (Mw) of the additives shown in the following tables, the values measured by a GPC (gel permeation chromatography) method and calculated relative to polystyrene standards were employed.

<Evaluation of Polishing Performance>

As objects to be polished, 200-mm wafer (Poly-Si (polysilicon film): formed by a CVD method)
200-mm wafer (SiN (silicon nitride film): formed by a CVD method)
200-mm wafer (TEOS (silicon oxide film): formed by a CVD method)
200-mm wafer (Low-k material (silicon oxide film containing a methyl group): formed by an SOD method) were prepared, and the various wafers were polished using the polishing compositions obtained as described above under the following polishing conditions. The polishing speeds were measured. Furthermore, the selection ratios were calculated.

(Polishing Conditions)
Polishing machine: CMP single-sided polishing machine for 200-mm wafers
Polishing pad: Pad made of polyurethane (IC1010: manufactured by Rohm and Haas Company)
Pressure: 3 psi (about 20.7 kPa)
Speed of rotation of platen (table): 90 rpm
Speed of rotation of head (carrier): 87 rpm
Flow rate of polishing composition: 130 ml/min
Polishing time: 1 minute
(Polishing Speed)
The polishing speed (polishing rate) was calculated by the following formula.

$$\text{Polishing rate[Å/min]} = \frac{\text{Film thickness before polishing[Å]} - \text{film thickness after polishing[Å]}}{\text{Polishing time[min]}} \quad \text{[Mathematical Formula 1]}$$

The film thickness was determined using a light interference type film thickness measuring apparatus (manufactured by KLA-Tencor Corporation, Product No.: ASET), and an evaluation was carried out by dividing the differences by the polishing time.

(Selection Ratio)

The selection ratio is defined as the proportion between the polishing speed (Å/min) for film type (a) (SiN (silicon nitride film)) and the polishing speed (Å/min) for film type (b). The selection ratio was determined by the calculation formula: (a)÷(b). The measurement results for the polishing speeds and the selection ratio are respectively presented in the following tables.

Meanwhile, the CAS registration numbers, manufacturers, and product numbers of the additives are described in the following tables.

TABLE 1

| Example/ Comparative Example | Name of additive | Concentration [ppm by mass] | Poly-Si [Å/min] | TEOS [Å/min] | Low-k [Å/min] | SiN [Å/min] |
|---|---|---|---|---|---|---|
| Comparative Example | — | — | 26 | 11 | 78 | 245 |
| Example | Bis(2-ethylhexyl) phosphate | 100 | 23 | 10 | 32 | 305 |
| Example | Dilauryl hydrogen phosphite | 100 | 19 | 8 | 15 | 237 |
| Example | Butyl acid phosphate | 100 | 11 | 4 | 43 | 287 |
| Example | Mixture of monobutoxyethyl acid phosphate and dibutoxyethyl acid phosphate | 100 | 14 | 6 | 34 | 249 |
| Example | Mixture of polyoxyethylene isodecyl ether sulfuric acid ester ammonium salt and polyoxyethylene isodecyl ether | 100 | 13 | 5 | 25 | 233 |
| Example | 2-Ethylhexyl sulfuric acid ester sodium salt | 100 | 17 | 4 | 25 | 257 |
| Comparative Example | Polyoxyethylene allyl phenyl ether phosphate amine salt | 100 | Data not obtained due to aggregation | | | |
| Comparative Example | Di-POE(6) alkyl ether phosphoric acid (C12-15) | 100 | 4 | 2 | 30 | 33 |
| Comparative Example | Naphthalenesulfonic acid polymer (naphthalenesulfonic acid salt-formaldehyde condensate) | 100 | 34 | 14 | 78 | 12 |
| Comparative Example | 6-Amino-2-naphthalenesulfonic acid monohydrate | 100 | 41 | 17 | 94 | 29 |

TABLE 1-continued

| Example/ Comparative Example | Name of additive | Concentration [ppm by mass] | Polishing speed | | | |
|---|---|---|---|---|---|---|
| | | | Poly-Si [A/min] | TEOS [A/min] | Low-k [A/min] | SiN [A/min] |
| Comparative Example | 2-Naphthalenesulfonic acid hydrate | 100 | 30 | 21 | 116 | 32 |

* The term "POE(6)" in "Di-POE(6) alkyl ether phosphoric acid (C12-15)" means that the compound has six polyoxyethylene units, and the term C12-15 means that the compound is a mixture of compounds having 12 to 15 carbon atoms.

TABLE 2

| Example/ Comparative Example | Name of additive | Selection ratio | | |
|---|---|---|---|---|
| | | SiN(a)/ Poly-Si(b) | SiN(a)/ TEOS(b) | SiN(a)/ Low-k(b) |
| Comparative Example | — | 9.4 | 22.7 | 3.1 |
| Example | Bis(2-ethylhexyl) phosphate | 13.2 | 31.6 | 9.4 |
| Example | Dilauryl hydrogen phosphite | 12.2 | 29.4 | 16 |
| Example | Butyl acid phosphate | 26.9 | 64.6 | 6.7 |
| Example | Mixture of monobutoxyethyl acid phosphate and dibutoxyethyl acid phosphate | 17.4 | 41.8 | 7.3 |
| Example | Mixture of polyoxyethylene isodecyl ether sulfuric acid ester ammonium salt and polyoxyethylene isodecyl ether | 17.9 | 46.6 | 9.3 |
| Example | 2-Ethylhexyl sulfuric acid ester sodium salt | 15.1 | 64.3 | 10.3 |
| Comparative Example | Polyoxyethylene allyl phenyl ether phosphate amine salt | Data not obtained due to aggregation | | |
| Comparative Example | Di-POE(6) alkyl ether phosphoric acid (C12-15) | 8.3 | 20 | 1.1 |
| Comparative Example | Naphthalenesulfonic acid polymer (naphthalenesulfonic acid salt-formaldehyde condensate) | 0.4 | 0.9 | 0.2 |
| Comparative Example | 6-Amino-2-naphthalenesulfonic acid monohydrate | 0.7 | 1.7 | 0.3 |
| Comparative Example | 2-Naphthalenesulfonic acid hydrate | 1.1 | 1.5 | 0.3 |

TABLE 3

| Cas. | Name of additive |
|---|---|
| 298-07-7 | Bis(2-ethylhexyl)phosphate |
| 21302-09-0 | Dilauryl hydrogen phosphite |
| 107-66-4 | Butyl acid phosphate |
| 93-00-5 | 6-Amino-2-naphthalenesulfonic acid monohydrate |
| 76530-12-6 | 2-Naphthalenesulfonic acid hydrate |
| 126-92-1 | 2-Ethylhexyl sulfuric acid ester sodium salt |

TABLE 4

| Product No. of additive | Name of additive |
|---|---|
| Takemoto Oil and Fat Co., Ltd.: NEWCALGEN FS-3AQ | Polyoxyethylene allyl phenyl ether phosphate amine salt |
| Nikko Chemicals Co, Ltd.: DDP-6 | Di-POE(6) alkyl ether phosphoric acid (C12-15) |
| San Nopco Limited: LOMAR PWA40 | Naphthalenesulfonic acid polymer (naphthalenesulfonic acid salt-formaldehyde condensate) |
| Johoku Chemical Co., Ltd.: JP-506H | Mixture of monobutoxyethyl acid phosphate and dibutoxyethyl acid phosphate |
| DKS Co., Ltd.: HITENOL PS-06 | Mixture of polyoxyethylene isodecyl ether sulfuric acid ester ammonium salt and polyoxyethylene isodecyl ether |

TABLE 5

| Example/ Comparative example | Name of additive | Concentration [ppm by mass] | Polishing speed | | | |
|---|---|---|---|---|---|---|
| | | | Poly-Si [A/min] | TEOS [A/min] | Low-k [A/min] | SiN [A/min] |
| Comparative Example | — | — | 26 | 11 | 78 | 245 |
| Example | Polyacrylate-based copolymer | 100 | 17 | 7 | 38 | 281 |

TABLE 5-continued

| Example/ Comparative example | Name of additive | Concentration [ppm by mass] | Polishing speed | | | |
|---|---|---|---|---|---|---|
| | | | Poly-Si [A/min] | TEOS [A/min] | Low-k [A/min] | SiN [A/min] |
| Example | Acrylic acid-based polymer sodium salt | 100 | 8 | 3 | 4 | 124 |
| Example | (1) Acrylic acid-based polymer | 100 | 16 | 10 | 55 | 303 |
| Example | (2) Acrylic acid-based polymer | 100 | 14 | 6 | 32 | 168 |
| Example | (3) Acrylic acid-based polymer (Mw 100000) | 100 | 12 | 5 | 27 | 102 |
| Example | (4) Acrylic acid-based polymer (Mw 100000) | 100 | 13 | 5 | 29 | 93 |
| Example | (1) Maleic acid-based polymer (Mw 10000) | 100 | 16 | 10 | 56 | 199 |
| Example | (2) Maleic acid-based polymer (Mw 10000) | 100 | 14 | 6 | 32 | 300 |
| Example | (3) Maleic acid-based polymer (Mw 10000) | 100 | 13 | 5 | 30 | 307 |
| Comparative Example | Polyoxyethylene allyl phenyl ether phosphate amine salt | 100 | Data not obtained due to aggregation | | | |
| Comparative Example | Naphthalenesulfonic acid polymer (naphthalenesulfonic acid salt-formaldehyde condensate) | 100 | 34 | 14 | 78 | 12 |
| Comparative Example | 6-Amino-2-naphthaenesulfonic acid monohydrate | 100 | 41 | 17 | 94 | 29 |
| Comparative Example | 2-Naphthalenesulfonic acid hydrate | 100 | 30 | 21 | 116 | 32 |

TABLE 6

| Example/ Comparative Example | Name of additive | Selection ratio | | |
|---|---|---|---|---|
| | | Sin(a)/ Poly-Si(b) | Sin(a)/ TEOS(b) | Sin(a)/ Low-k(b) |
| Comparative Example | — | 9.4 | 22.7 | 3.1 |
| Example | Polyacrylate-based copolymer | 16.8 | 40.4 | 7.3 |
| Example | Acrylic acid-based polymer sodium salt | 16.3 | 39.1 | 34.4 |
| Example | (1) Acrylic acid-based polymer | 19.0 | 30.5 | 5.5 |
| Example | (2) Acrylic acid-based polymer | 11.9 | 28.7 | 5.2 |
| Example | (3) Acrylic acid-based polymer (Mw 20000) | 8.8 | 21.0 | 3.8 |
| Example | (4) Acrylic acid-based polymer (Mw 100000) | 7.3 | 17.6 | 3.2 |
| Example | (1) Maleic acid-based polymer (Mw 10000) | 12.4 | 19.7 | 3.6 |
| Example | (2) Maleic acid-based polymer (Mw 10000) | 21.1 | 50.8 | 9.2 |
| Example | (3) Maleic acid-based polymer (Mw 10000) | 23.6 | 50.9 | 10.3 |
| Comparative Example | Polyoxyethylene allyl phenyl ether phosphate amine salt | Data not obtained due to aggregation | | |
| Comparative Example | Naphthalenesulfonic acid polymer (naphthalenesulfonic acid salt-formaldehyde condensate) | 0.4 | 0.9 | 0.2 |
| Comparative Example | 6-Amino-2-naphthaenesulfonic acid monohydrate | 0.7 | 1.7 | 0.3 |
| Comparative Example | 2-Naphthalenesulfonic acid hydrate | 1.1 | 1.5 | 0.3 |

TABLE 7

| Cas. | Name of additive | |
|---|---|---|
| 93-00-5 | 6-Amino-2-naphthalenesulfonic acid monohydrate | 55 |
| 76530-12-6 | 2-Naphthalenesulfonic acid hydrate | |

TABLE 8

| Additive Product No. | Name of additive |
|---|---|
| BYK GmbH: DISPERBYK-199 | Polyacrylate-based copolymer |
| BWA Water Additives US, LLC: DP6030 | Acrylic acid-based polymer sodium salt |
| BYK GmbH: DISPERBYK 2060 | (1) Acrylic acid-based polymer |
| BYK GmbH: BYK LPC 22092 | (2) Acrylic acid-based polymer |
| San Nopco Limited: SN DISPERSANT 5020 | (3) Acrylic acid-based polymer (Mw 20000) |

TABLE 8-continued

| Additive Product No. | Name of additive |
|---|---|
| San Nopco Limited: NOPCOSANT RFA | (4) Acrylic acid-based polymer (Mw 100000) |
| San Nopco Limited: NOPCALL 5200 | (1) Maleic acid-based polymer (Mw 10000) |
| San Nopco Limited: SN DISPERSANT 5029 | (2) Maleic acid-based polymer (Mw 10000) |
| San Nopco Limited: SN DISPERSANT 5027 | (3) Maleic acid-based polymer (Mw 10000) |
| Takemoto Oil and Fat Co., Ltd.: NEWCALGEN FS-3AQ | Polyoxyethylene allyl phenyl ether phosphate amine salt |
| San Nopco Limited: LOMAR PWA40 | Naphthalenesulfonic acid polymer (naphthalenesulfonic acid salt-formaldehyde condensate) |

<Inference>

According to the polishing compositions of Examples, since particular selection ratio improvers are incorporated therein, when referring to selection ratios of each material (b), it can be seen that the selection ratios have improved compared to the Comparative Examples that did not have any additives incorporated therein.

In contrast, in the polishing compositions of Comparative Examples, the selection ratio for the material (a) could not be improved with respect to all of the materials (b).

The present patent application is based on Japanese Patent Application No. 2016-067146 and Japanese Patent Application No. 2016-067158, both filed on Mar. 30, 2016, the disclosures of which are entirely incorporated by reference.

The invention claimed is:

1. A polishing composition used for polishing an object to be polished including (a) material having silicon-nitrogen bonds; and (b) other material, the polishing composition comprising:

an organic acid-immobilized silica; and a selection ratio improver capable of improving the ratio of the polishing speed for the material (a) with respect to the polishing speed for the material (b), wherein the selection ratio improver is (i) a compound represented by at least one of the following Formula 1 and the following Formula 2:

[Formula 1]

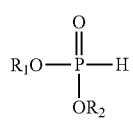

(1)

[Formula 2]

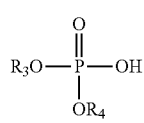

(2)

wherein $R_1$, $R_2$, $R_3$, and $R_4$ each independently represent a substituted or unsubstituted alkyl group having 1 to 20 carbon atoms, or a substituted or unsubstituted aryl group having 6 to 20 carbon atoms;

(ii) a polymer having a constituent unit derived from an unsaturated carboxylic acid; or (iii) a compound represented by the following Formula 3:

[Formula 3]

(3)

wherein $R_5$ represents a substituted or unsubstituted branched alkyl group having 3 to 20 carbon atoms, or is represented by the following Formula 4:

$$-(OE)_n OR_6 \quad \text{[Formula 4]}$$

wherein E represents an alkylene group having 1 to 3 carbon atoms; $R_6$ represents a substituted or unsubstituted branched alkyl group having 3 to 20 carbon atoms, or an aryl group having a branched alkyl group having 3 to 20 carbon atoms; n is 2 to 100; provided that a plurality of E may be identical with or different from each other; and wherein the selection ratio improver may be in the form of a salt.

2. The polishing composition according to claim 1, wherein the number of carbon atoms of the alkyl group is 2 to 15.

3. The polishing composition according to claim 1, wherein the substituent for the alkyl group is an alkoxy group having 1 to 10 carbon atoms or an aryl group having 6 to 20 carbon atoms.

4. The polishing composition according to claim 1, wherein the constituent unit derived from an unsaturated carboxylic acid is a (meth)acrylic acid-derived constituent unit or a maleic acid-derived constituent unit.

5. The polishing composition according to claim 1, wherein the number of carbon atoms of the branched alkyl group is 5 to 11.

6. The polishing composition according to claim 1, wherein the organic acid-immobilized silica is sulfonic acid-immobilized silica.

7. The polishing composition according to claim 1, wherein the other material (b) is at least one selected from the group consisting of:

a metal material selected from tungsten, tantalum, titanium, cobalt, ruthenium, hafnium and aluminum;

an alloy material formed by compositizing the above-described metal material with nitrogen, oxygen, silicon, carbon, or phosphorus;

a material having silicon-silicon bonds;

a low permittivity material; and an insulating material.

8. The polishing composition according to claim 1, wherein the polishing composition has a pH value of 0.5 to 6.0.

9. A method for improving the ratio of the polishing speed for material (a) with respect to the polishing speed for material (b), on the occasion of polishing an object to be polished including: (a) material having silicon-nitrogen bonds; and (b) other material, using a polishing composition, the method comprising incorporating:

an organic acid-immobilized silica; and a selection ratio improver capable of improving the ratio of the polishing speed for the material (a) with respect to the polishing speed for the material (b) into the polishing composition, wherein the selection ratio improver is:

(i) a compound represented by at least one of the following Formula 1 and the following Formula 2:

[Formula 1]

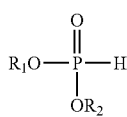

(1)

[Formula 2]

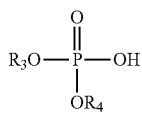

(2)

wherein $R_1$, $R_2$, $R_3$, and $R_4$ each independently represent a substituted or unsubstituted alkyl group having 1 to 20 carbon atoms, or a substituted or unsubstituted aryl group having 6 to 20 carbon atoms;

(ii) a polymer having a constituent unit derived from an unsaturated carboxylic acid; or (iii) a compound represented by the following Formula 3:

[Formula 3]

(3)

wherein $R_5$ represents a substituted or unsubstituted branched alkyl group having 3 to 20 carbon atoms, or is represented by the following moiety:

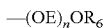

—$(OE)_nOR_6$ wherein E represents an alkylene group having 1 to 3 carbon atoms; $R_6$ represents a substituted or unsubstituted branched alkyl group having 3 to 20 carbon atoms, or an aryl group having a branched alkyl group having 3 to 20 carbon atoms; n is from 2 to 100; provided that a plurality of E may be identical with or different from each other; and wherein the selection ratio improver may be in the form of a salt.

10. A polishing method, comprising polishing an object to be polished including (a) material having silicon-nitrogen bonds; and (b) other material, using the polishing composition according to claim 1.

11. A method for producing a substrate, comprising the polishing method according to claim 10.

* * * * *